(12) United States Patent
Yamaguchi et al.

(10) Patent No.: US 8,458,901 B2
(45) Date of Patent: Jun. 11, 2013

(54) ELECTRONIC COMPONENT EMBEDDED CONNECTOR, AND METHOD AND DEVICE FOR MANUFACTURING THE SAME

(75) Inventors: Shinji Yamaguchi, Saitama (JP); Tetsu Hirose, Saitama (JP); Kenichi Abe, Kanagawa (JP)

(73) Assignees: Union Machinery Co., Ltd., Kanagawa (JP); Furukawa Electric Co., Ltd., Tokyo (JP); Furukawa Automotive Systems, Inc., Shiga (JP)

( * ) Notice: Subject to any disclaimer, the term of this patent is extended or adjusted under 35 U.S.C. 154(b) by 238 days.

(21) Appl. No.: 13/057,406

(22) PCT Filed: Jul. 13, 2009

(86) PCT No.: PCT/JP2009/003274
§ 371 (c)(1),
(2), (4) Date: Apr. 22, 2011

(87) PCT Pub. No.: WO2010/016188
PCT Pub. Date: Feb. 11, 2010

(65) Prior Publication Data
US 2011/0189893 A1     Aug. 4, 2011

(30) Foreign Application Priority Data
Aug. 4, 2008   (JP) ................................. 2008-200826

(51) Int. Cl.
H05K 3/30 (2006.01)

(52) U.S. Cl.
USPC ............................... 29/841; 439/76.2; 29/264

(58) Field of Classification Search
USPC ........................................ 439/76.2; 29/841
See application file for complete search history.

(56) References Cited

U.S. PATENT DOCUMENTS

| | | | |
|---|---|---|---|
| 5,535,509 A | 7/1996 | Tomita et al. | |
| 5,909,915 A * | 6/1999 | Okuda | 29/841 |
| 2001/0006688 A1 | 7/2001 | Soga et al. | |
| 2001/0026665 A1 * | 10/2001 | Ando et al. | 385/94 |
| 2002/0023784 A1 * | 2/2002 | Suzuki et al. | 177/50 |
| 2004/0240190 A1 * | 12/2004 | Hsu et al. | 361/797 |
| 2007/0066139 A1 * | 3/2007 | Roeper et al. | 439/607 |
| 2007/0138697 A1 | 6/2007 | Takeda et al. | |
| 2009/0268414 A1 * | 10/2009 | Lu | 361/736 |

FOREIGN PATENT DOCUMENTS

| | | |
|---|---|---|
| DE | 3323346 A1 | 1/1985 |
| JP | 55-138227 A | 10/1980 |
| JP | 05-326791 A | 12/1993 |
| JP | 05-343445 A | 12/1993 |
| JP | 09-129799 A | 5/1997 |
| JP | 2001-085120 A | 3/2001 |
| JP | 2003-243105 A | 8/2003 |
| JP | 2003-272798 A | 9/2003 |
| JP | 2004-119579 A | 4/2004 |
| JP | 2007-317445 A | 6/2007 |

* cited by examiner

*Primary Examiner* — Truc Nguyen
(74) *Attorney, Agent, or Firm* — Knobbe Martens Olson & Bear LLP

(57) ABSTRACT

A method for manufacturing an electronic component embedded connector includes a first step for fixing a terminal to a fixing means; a second step for fixing electronic components to the fixing means; a third step for cutting connecting sections of the terminal fixed to the fixing means; a fourth step for connecting the electronic components fixed to the fixing means, to the terminal in which the connecting sections are cut off; and a fifth step for covering a section of the terminal other than terminal sections, and the electronic components by an insulating cover.

5 Claims, 7 Drawing Sheets

ELECTRONIC COMPONENT EMBEDDED CONNECTOR, AND METHOD AND DEVICE FOR MANUFACTURING THE SAME

This application is the U.S. National Phase under 35. U.S.C. §371 of International Application PCT/JP2009/003274, filed Jul. 13, 2009, which claims priority to Japanese Patent Application No. 2008-200826, filed Aug. 4, 2008. The International Application was published under PCT Article 21(2) in a language other than English

TECHNICAL FIELD

The present invention relates to a connector in which electronic components such as diodes are embedded, and to a method and a device for manufacturing the electronic component embedded connector.

BACKGROUND ART

Recently, vehicles such as automobiles have been sophisticated, and a wide variety of electronic components are equipped in such a vehicle. Meanwhile, a technology continues to progress in control unit sharing of the electronic components for the purpose of cost reduction. In order to control a wide variety of electronic components by the shared control unit, a functional connector for supplementing functions of the control unit is used (see, e.g., Patent Document 1).

As illustrated in FIGS. 9 and 10, Patent Document 1 discloses a connector in which a terminal formed by connecting a frame 101 and terminal sections 104a, 104b, and 104c together through a connecting tie bar 102 and supplemental tie bars 103a and 103b is molded with a resin mold 106; the connecting tie bar 102 etc. are cut off; and a recessed section 161 is provided in the resin mold 106 so that a pin-like cut section 121' formed by cutting the connecting tie bar 102 does not protrude from the resin mold 106.

According to the foregoing configuration, the pin-like cut section of the terminal is less likely to contact other components, thereby reducing the size of the connector, and enhancing reliability of the connector.

CITATION LIST

Patent Document

PATENT DOCUMENT 1: Japanese Patent Publication No. 2004-119579

SUMMARY OF THE INVENTION

Technical Problem

However, in the connector of Patent Document 1, even if the pin-like cut section is less likely to contact other components, the pin-like cut section is exposed. Thus, there is a problem that undesirable conduction is caused. In addition, there is a problem that moisture is adhered to the pin-like cut section, resulting in accelerated corrosion.

The present invention has been made in view of the foregoing, and it is an object of the present invention to ensure a connection of electronic components to a terminal in a configuration in which a section of the terminal other than terminal sections is not exposed, and is covered by an insulting member.

Solution to the Problem

In order to accomplish the foregoing object, in a method for manufacturing an electronic component embedded connector including a terminal having a plurality of wire sections and terminal sections; electronic components connected to the wire sections of the terminal; and an insulating cover covering the electronic components and the wire sections of the terminal, such a method includes a first step for fixing the terminal in which the wire sections are connected together by connecting sections, to fixing means made of insulating material; a second step for fixing the electronic components to the fixing means; a third step for cutting the connecting sections of the terminal fixed to the fixing means; a fourth step for connecting the electronic components fixed to the fixing means, to the terminal in which the connecting sections are cut off; and a fifth step for covering a section of the terminal other than the terminal sections, and the electronic components by the insulating cover.

It is preferred that the electronic component includes lead terminals; a first holding section for holding the lead terminal is formed in the fixing means; a second holding section for holding the lead terminal, which is arranged parallel to the first holding section is formed in the wire section of the terminal; at the second step, the lead terminal of the electronic component is held by the first holding section to fix the electronic component to the fixing means; and at the fourth step, the lead terminal of the electronic component is held by the second holding section in a state in which the lead terminal is held by the first holding section, and then the electronic component is connected to the terminal.

In a device for manufacturing an electronic component embedded connector including a terminal having a plurality of wire sections and terminal sections; electronic components connected to the wire sections of the terminal; and an insulating cover covering the electronic components and the wire sections of the terminal, such a device includes a lower mold on which fixing means made of insulating material is mounted; and an upper mold which is arranged so as to face the lower mold, and which upwardly/downwardly moves so as to separate from the lower mold or approach the lower mold. The electronic components and the terminal having connecting sections for connecting the wire sections together are fixed to the fixing means mounted on the lower mold. The upper mold includes cutting tools for cutting the connecting sections of the terminal fixed to the fixing means mounted on the lower mold when the upper mold downwardly moves to approach and contact the lower mold; and a connecting tool for connecting the electronic components and the wire sections of the terminal, which are fixed to the fixing means mounted on the lower mold when the upper mold downwardly moves to approach and contact the lower mold. The cutting of the connecting sections by the cutting tools is performed before the connecting of the wire sections and the electronic components by the connecting tool.

The cutting tools and the connecting tool may move to a use position above the fixing means when using the cutting tools and the connecting tool, and may move to a retreat position displaced from the use position when not using the cutting tools and the connecting tool. The upper mold may downwardly move toward the lower mold in a state in which the cutting tools move to the use position, and the connecting tool moves to the retreat position; or may downwardly move toward the lower mold in a state in which the connecting tool moves to the use position, and the cutting tools move to the retreat position.

An electronic component embedded connector is manufactured by the foregoing method.

Features

Next, features of the present invention will be described.

When manufacturing the connector, the terminal including the plurality of wire sections and the terminal sections is mounted on the fixing means made of insulating material at the first step. At this point, in the terminal, the wire sections are connected together by the connecting sections.

Next, at the second step, the electronic components are fixed to the fixing means. For example, if the electronic component includes the lead terminals, and the first holding section is formed in the fixing means, the lead terminal may be held by the first holding section to fix the electronic component to the fixing means at the second step.

Next, at the third step, the connecting sections of the terminal fixed to the fixing means are cut off. At this point, the electronic components are not connected to the terminal, and therefore transmission of external stress applied to the terminal when cutting the connecting sections, to the electronic components can be reduced or prevented.

Next, at the fourth step, the electronic components fixed to the fixing means are connected to the terminal in which the connecting sections are cut off. The connecting sections are already cut off in the terminal, and therefore the connection between the wire section of the terminal and the electronic component can be properly maintained.

For example, at the fourth step, if the second holding section is formed parallel to the first holding section in the wire section of the terminal, the lead terminal is held by the second holding section in the state in which the lead terminal is held by the first holding section, thereby connecting the electronic component to the terminal.

Next, at the fifth step, the section of the terminal other than the terminal sections, and the electronic components are covered by the insulating cover. The electronic component embedded connector is manufactured by the foregoing steps.

According to the manufacturing method of the present invention, the connecting sections of the terminal are cut off before the electronic components are connected to the terminal. Thus, the transmission of the external stress applied to the terminal when cutting the connecting sections, to the sections where the terminal and the electronic components are connected together can be reduced or prevented, and therefore the connection between the wire section of the terminal and the electronic component can be properly maintained. Consequently, when covering the terminal and the electronic components by the insulating cover, the electronic components and the terminal are not necessarily fixed outside the insulating cover. As a result, the terminal and the electronic components can be covered by the insulating cover so that the section of the terminal other than the terminal sections are not exposed.

When manufacturing the connector by the manufacturing device, a cassette is first mounted on the lower mold. The terminal with the connecting sections, and the electronic components are mounted on the cassette.

Next, the connecting sections of the terminal mounted on the cassette are cut off by the cutting tools of the upper mold. In such a state, the upper mold may downwardly move toward the lower mold in the state in which the cutting tools are moved to the use position, and the connecting tool is moved to the retreat position. Subsequently, the wire sections of the terminal mounted on the cassette, and the electronic components are connected together by the connecting tool of the upper mold. In such a state, the upper mold may downwardly move toward the lower mold in the state in which the connecting tool is moved to the use position, and the cutting tools are moved to the retreat position.

Thus, according to the manufacturing device of the present invention, the connection between the wire section of the terminal and the electronic component can be properly maintained, and the terminal and the electronic components can be covered by the insulating cover so that the section of the terminal other than the terminal sections are not exposed.

Advantages of the Invention

According to the present invention, the electronic components are connected to the terminal after the connecting sections of the terminal are cut off, and therefore the transmission of the external stress applied to the terminal when cutting the connecting sections, to the sections where the wire sections of the terminal and the electronic components are connected together can be reduced or prevented. Thus, the connection between the wire section of the terminal and the electronic component can be properly maintained. Consequently, when covering the terminal and the electronic components by the insulating cover, the electronic components and the terminal are not necessarily fixed outside the insulating cover. As a result, the terminal and the electronic components can be covered by the insulating cover so that the section of the terminal other than the terminal sections are not exposed.

DESCRIPTION OF EMBODIMENTS

Embodiments of the present invention will be described below in detail with reference to the drawings. Note that the present invention is not limited to the embodiments below.

First Embodiment of the Invention

FIGS. 1-6 illustrate a first embodiment of the present invention.

Figure 6:
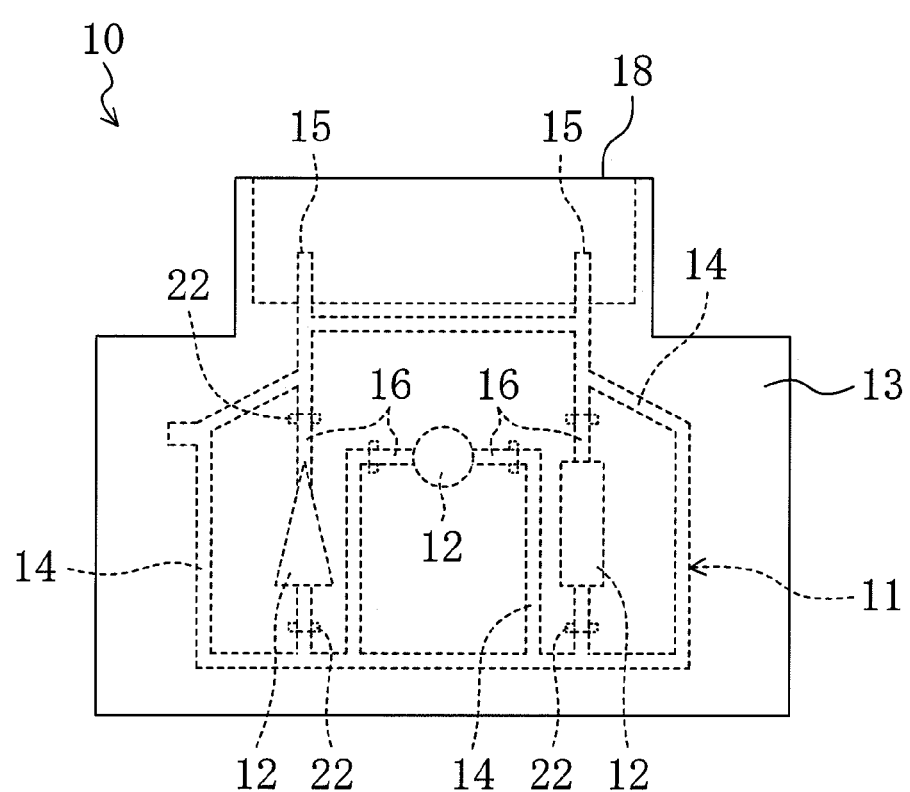
FIG. 6 is a plan view schematically illustrating a structure of an electronic component embedded connector of an embodiment.

FIG. 6 is a plan view schematically illustrating a structure of an electronic component embedded connector 10 of the present embodiment.

As illustrated in FIG. 6, the electronic component embedded connector 10 of the present embodiment includes a terminal 11; electronic components 12; and a resin mold 13 serving as an insulating cover for covering the terminal 11 and the electronic components 12. The electronic component embedded connector 10 is used as, e.g., a functional connector equipped in a vehicle such as automobiles.

The electronic component 12 includes lead terminals 16, and, e.g., resistors, diodes, capacitors, sensors, and light-emitting diodes may be employed as the electronic component 12. In the present embodiment, three electronic components 12 are connected in series. Note that the number of the electronic components 12 are not limited to three. In addition, a connection pattern of the electronic components 12 are not limited to the foregoing, and the electronic components 12 may be connected not only in series but also in parallel.

The terminal 11 includes a plurality of wire sections 14 and terminal sections 15 integrally formed with the wire sections 14. The terminal 11 is made of, e.g., copper and copper alloy (e.g., brass), and a surface of the terminal 11 is coated by Sn.

Figure 4:
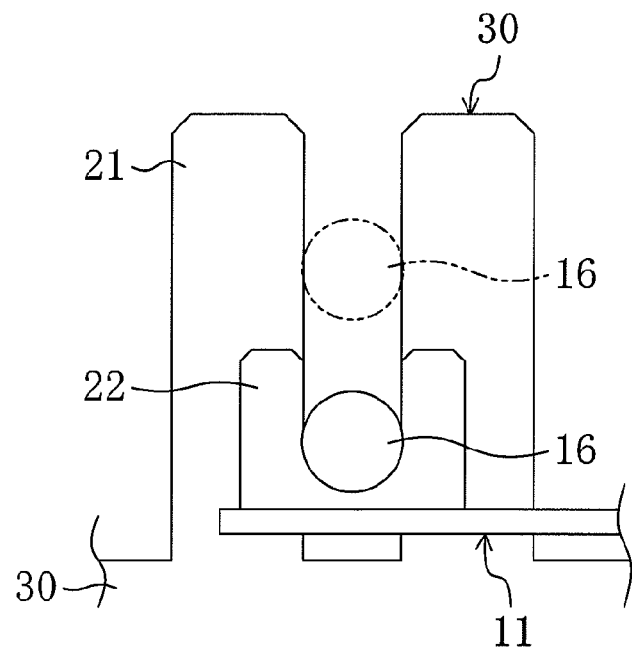
FIG. 4 is an enlarged front view illustrating a first holding section and a second holding section.

FIG. 4 is an enlarged front view illustrating a first holding section 21 and a second holding section 22 formed in a cassette (fixing means) 30 which will be described later. At an end of the wire section 14, the second holding section 22 is formed, which is provided parallel to the first holding section 21, and which holds the lead terminal 16. The second holding section 22 is formed in, e.g., bifurcated claw-like shape, and holds the lead terminal 16 by inserting the lead terminal 16 into the bifurcated section. The lead terminal 16 is held by the second holding section 22, and therefore the electronic component 12 is connected to the wire section 14 of the terminal 11.

The resin mold 13 covers the electronic components 12, as well as the wire sections 14 of the terminal 11. That is, an inserting port 18 of the connector 10 is formed in cylindrical shape in the resin mold 13. Inside the inserting port 18, the terminal sections 15 protrude toward an outside of the resin mold 13. In other words, a section of the terminal 11 other than the terminal sections 15 is covered by the resin mold 13.

Manufacturing Device

Next, a manufacturing device 1 of the electronic component embedded connector 10 will be described.

Figure 5:
FIG. 5 is a side view schematically illustrating a configuration of a manufacturing device.
Figure 5:
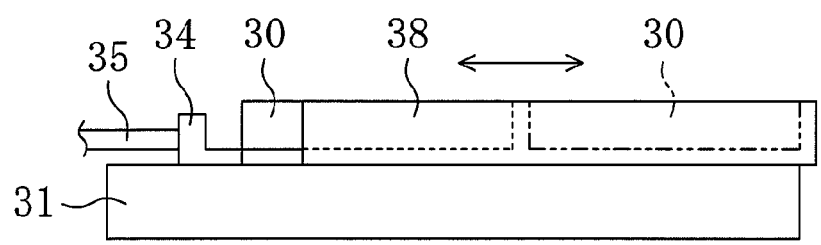

FIG. 5 is a side view schematically illustrating a configuration of the manufacturing device 1 of the electronic component embedded connector 10.

The manufacturing device 1 includes a lower mold 31 on which the cassette (fixing means) 30 made of insulating material and formed in rectangular parallelepiped shape is mounted; and an upper mold 32 which is arranged so as to face the lower mold 31, and which upwardly/downwardly moves so as to separate from the lower mold 31 or approach the lower mold 31.

As described later, the electronic components 12 and the terminal 11 including connecting sections 20 for connecting the wire sections 14 together are fixed to the cassette 30 mounted on the lower mold 31.

The upper mold 32 includes cutting tools (not shown in the figure) such as cut punches; and a connecting tool (not shown in the figure) such as crimp punches. Note that, other than the crimping, the connecting tool may be used for connection by soldering or by laser welding.

The cutting tool is configured to cut the connecting sections 20 of the terminal 11 fixed to the cassette 30 mounted on the lower mold 31 when the upper mold 32 downwardly moves to approach and contact the lower mold 31. On the other hand, the connecting tool is configured so that, when the upper mold 32 downwardly moves to approach and contact the lower mold 31, the electronic components 12 are connected to the wire sections 14 of the terminal 11 fixed to the cassette 30 mounted on the lower mold 31.

The manufacturing device 1 is configured so that the cutting of the connecting sections 20 by the cutting tools is performed before the connecting of the electronic components 12 and the wire sections 14 by the connecting tool. For example, in the upper mold 32, the cutting tools and the connecting tool move to a use position above the cassette 30 when using the cutting tools and the connecting tool, or move to a retreat position which is displaced from the use position when not using the cutting tools and the connecting tool.

The upper mold 32 downwardly moves toward the lower mold 31 in a state in which the cutting tools are in the use position, and the connecting tool is in the retreat position; or downwardly moves toward the lower mold 31 in a state in which the connecting tool is in the use position, and the cutting tools are in the retreat position.

Figure 1:
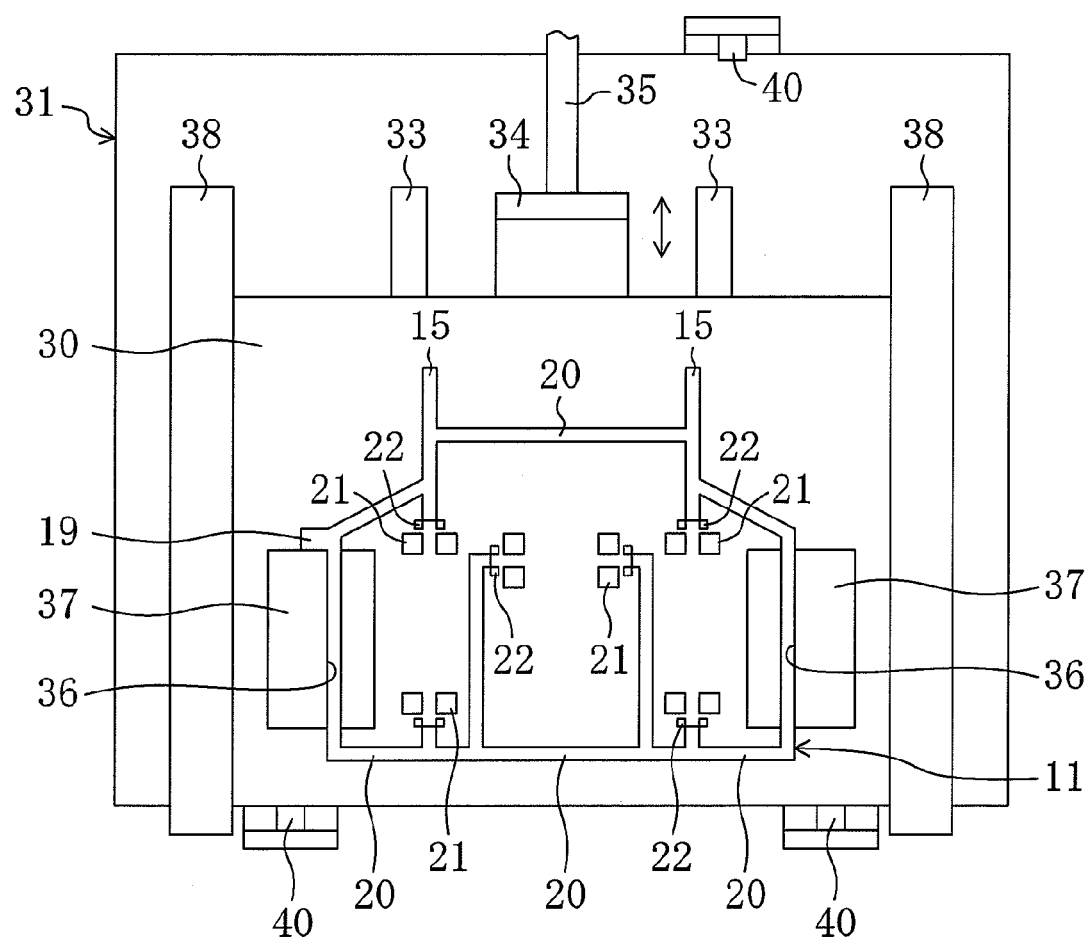
FIG. 1 is a plan view schematically illustrating a cassette and a lower mold when a terminal is mounted and fixed.
Figure 2:
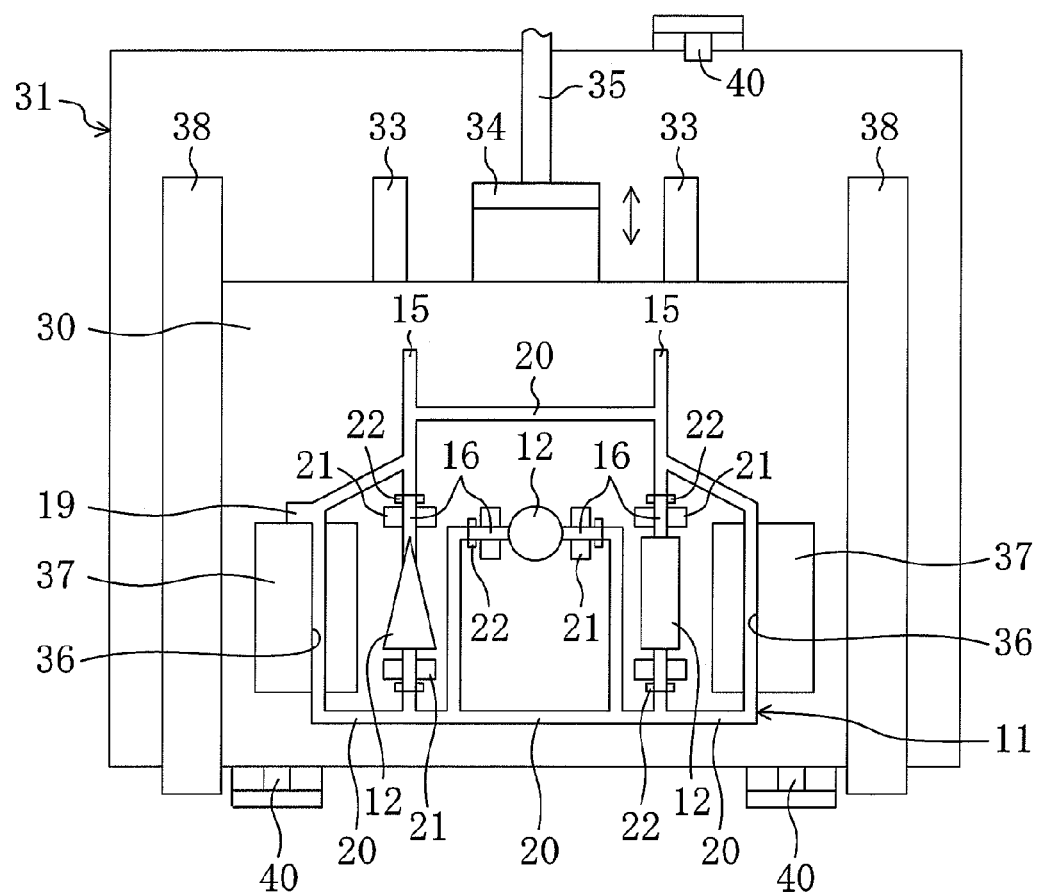
FIG. 2 is a plan view schematically illustrating the cassette and the lower mold when electronic components are mounted and fixed.
Figure 3:
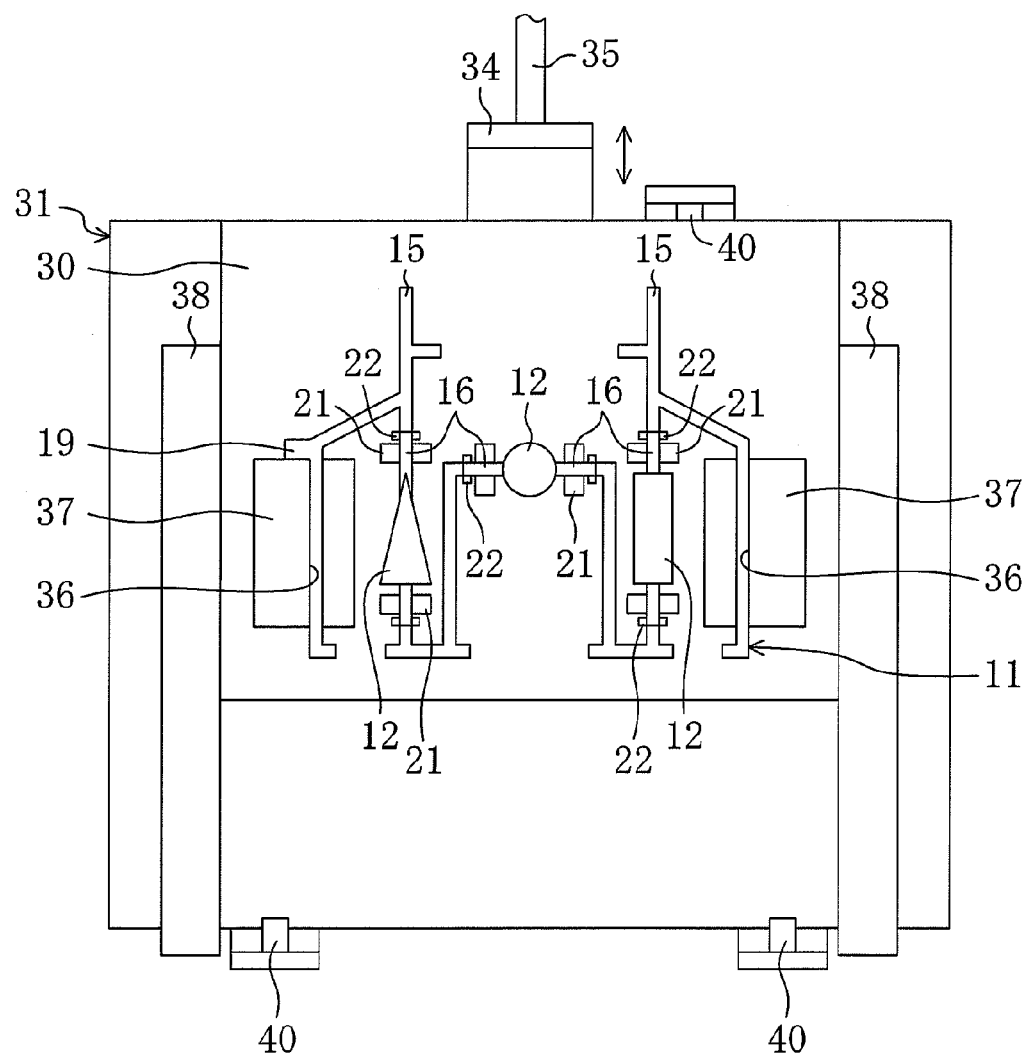
FIG. 3 is a plan view schematically illustrating a state in which connecting sections of the terminal are cut off.

FIG. 1 is a plan view schematically illustrating the cassette 30 and the lower mold 31 when the terminal 11 is mounted and fixed. FIG. 2 is a plan view schematically illustrating the cassette 30 and the lower mold 31 when the electronic components 12 are mounted and fixed. FIG. 3 is a plan view schematically illustrating a state in which the connecting sections 20 of the terminal 11 are cut off. FIG. 4 is an enlarged front view illustrating the first holding section 21 and the second holding section 22. Note that, in FIGS. 1-3, the sizes of the terminal 11 and the electronic components 12 in relation to the cassette 30 are shown as being relatively larger for purposes of simplifying the description.

As illustrated in FIG. 1, rails 33 and side guides 38 extending in a vertical direction as viewed in FIG. 1 are formed on an upper surface of the lower mold 31. A stage 34 which is guided and moves along the rails 33 and the side guides 38, and on which the cassette 30 is mounted is provided on the lower mold 31. A cylinder 35 serving as a drive mechanism is connected to the stage 34. By driving the cylinder 35, the stage 34 and the cassette 30 are slidably movable between a processing position illustrated on an upper side of FIG. 3 and an ejecting position illustrated in FIG. 1.

In the lower mold 31, shock absorbers 40 are provided, which contacts and stops the cassette 30 to absorb shock caused when moving the cassette 30 to the processing position or the ejecting position. Note that the shock absorber 40 for absorbing the shock from the cassette 30 moved to the processing position may be provided in the cylinder 35.

In the cassette 30, the first holding sections 21 for holding the lead terminals 16 of the electronic components 12 are formed. The first holding sections 21 are arranged corresponding to the second holding sections 22. As illustrated in FIG. 4, the first holding section 21 is formed in, e.g., bifurcated claw-like shape, and holds the lead terminal 16 by inserting the lead terminal 16 into the bifurcated section. The inner size of the bifurcated section of the first holding section 21 is the substantially same as that of the second holding section 22.

In the cassette 30, engagement sections 37 including grooves 36 to be engaged with the wire sections 14 of the terminal 11 are formed in raised shape. The groove 36 is formed so as to have the width which is the substantially same as that of the wire section 14. In the wire section 14 of the terminal 11, a protrusion 19 for positioning, which contacts the engagement section 37 is formed so as to protrude toward side.

Manufacturing Method

Next, a manufacturing method of the electronic component embedded connector 10 will be described.

First, a terminal 11 is formed in substantially ring-like shape by punching through a metal plate made of, e.g., copper and copper alloy such as brass, and then a surface of the terminal 11 is coated by Sn.

Next, an upper mold 32 of a manufacturing device 1 upwardly moves to be apart from a stage 34 with a sufficient distance. Subsequently, a cylinder 35 is driven to slidably move the stage 34 from a processing position to an ejecting position on a lower mold 31. Shock absorbers 40 absorb shock caused when a cassette 30 moves and stops in the ejecting position. As illustrated in FIG. 1, the cassette 30 is mounted on the stage 34 which is in the ejecting position.

Subsequently, at a first step, the terminal 11 in which wire sections 14 are connected together by connecting sections 20 is mounted and fixed on the cassette 30 which is in the ejecting position as illustrated in FIG. 1. In such a state, the wire sections 14 of the terminal 11 are engaged with grooves 36 formed in engagement sections 37 of the cassette 30, and a protrusion 19 of the terminal 11 contacts a side surface of the engagement section 37 for positioning. This allows the terminal 11 to be fixed in a proper position.

Next, at a second step, three electronic components 12 such as resistors, diodes, capacitors, sensors, and light-emitting diodes are mounted and fixed on the cassette 30 which is in the ejecting position as illustrated in FIG. 2. That is, as illustrated in FIGS. 2 and 4, the lead terminals 16 of the electronic components 12 are held by first holding sections 21 of the cassette 30, thereby fixing the electronic components 12 to the cassette 30. At this point, as indicated by a chain double-dashed line of FIG. 4, the lead terminal 16 is not held by a second holding section 22 of the terminal 11, and is held only by the first holding section 21 of the cassette 30 above the second holding section 22.

Next, at a third step, the cylinder 35 is driven to slidably move the cassette 30 which is in the ejecting position, to the processing position as illustrated in FIG. 3. The shock absorber 40 absorbs shock caused when the cassette 30 moves and stops in the processing position. Meanwhile, in the upper mold 32, a crimp punch (not shown in the figure) which serves as a connecting tool is moved to a retreat position, and cut punches (not shown in the figure) which serve as cutting tools are moved to a use position. Then, the upper mold 32 downwardly moves toward the lower mold 31, and therefore the four connecting sections 20 of the terminal 11 fixed to the cassette 30 are cut off. Subsequently, the upper mold 32 upwardly moves away from the lower mold 31.

At a fourth step, in the upper mold 32, the cut punches are moved from the use position to the retreat position, and the crimp punch is moved from the retreat position to the use position. Then, the upper mold 32 downwardly moves toward the lower mold 31, and therefore the electronic components 12 fixed to the cassette 30 are connected to the terminal 11 in which the connecting sections 20 are cut off.

That is, as illustrated in FIG. 4, the lead terminal 16 held by the first holding section 21 in the position indicated by the chain double-dashed line of FIG. 4 is downwardly pressed by the crimp punch, and then is moved to a position indicated by a solid line of FIG. 4. This allows the lead terminal 16 to be held by the second holding section 22 of the terminal 11 in a state in which the lead terminal 16 is held by the first holding section 21 of the cassette 30, thereby connecting the electronic component 12 to the terminal 11.

The width of a groove of a bifurcated section of the second holding section 22 is narrower than the diameter of the lead terminal 16. Thus, when pressing the lead terminal 16 into the bifurcated section of the second holding section 22 by the crimp punch, a new contact surface is defined, and then the lead terminal 16 and the second holding section 22 are connected together by pressing against each other. This allows the electronic component 12 and the terminal 11 to be placed in a good conduction state through the new contact surface defined by pressing against each other.

Subsequently, the cylinder 35 is driven to slidably move the cassette 30 which is in the processing position, to the ejecting position. The terminal 11 to which the electronic components 12 are connected is removed from the cassette 30 which is in the ejecting position.

Next, at a fifth step, the terminal 11 to which the electronic components 12 are connected is placed inside a mold (not shown in the figure), and then resin material including, e.g., PP, PBT, and material made by mixing glass fibers with PP or PBT is injected. In such a manner, a section of the terminal 11 other than the terminal sections 15 and the electronic components 12 are covered by a resin mold 13, thereby manufacturing an electronic component embedded connector 10 illustrated in FIG. 6.

Advantages of First Embodiment

According to the first embodiment, the connecting sections 20 of the terminal 11 are cut off, and then the electronic components 12 are connected to the terminal 11. This reduces or prevents transmission of external stress applied to the terminal 11 when cutting the connecting sections 20, to sections where the terminal 11 and the electronic components 12 are connected together. Thus, the connection between the wire section 14 of the terminal 11 and the electronic component 12 can be properly maintained. Consequently, when covering the terminal 11 and the electronic components 12 by the resin mold 13, the electronic components 12 and the terminal 11 are not necessarily fixed outside the resin mold 13, and therefore the terminal 11 and the electronic components 12 can be covered by the resin mold 13 so that the section of the terminal 11 other than the terminal sections 15 is not exposed. As a result, corrosion of the terminal 11 can be reduced or prevented, thereby improving reliability of the connector 10.

The lead terminal 16 of the electronic component 12 is held by the second holding section 22 of the terminal 11 in the state in which the lead terminal 16 is held by the first holding section 21 of the cassette 30. Thus, the connection between the lead terminal 16 and the terminal 11 can be easily ensured.

On the lower mold 31, the cassette 30 slidably moves between the processing position which is below the upper mold 32 and the ejecting position. Thus, the mounting of the terminal 11 and the electronic components 12 on the cassette 30, and the ejection of the terminal 11 to which the electronic components 12 are connected can be safely performed.

Second Embodiment of the Invention

Figure 7:
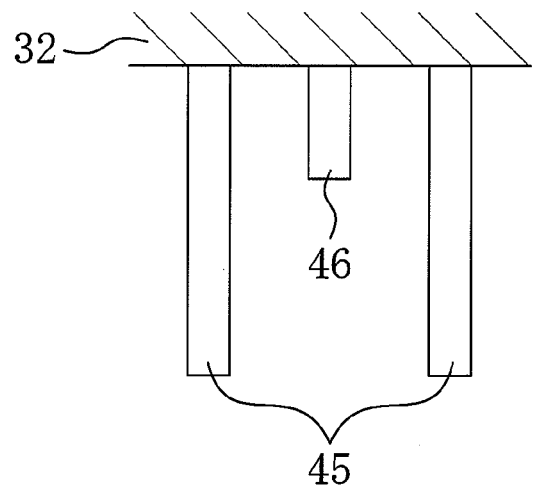
FIG. 7 is a side view illustrating a main section of an upper mold.
Figure 8:
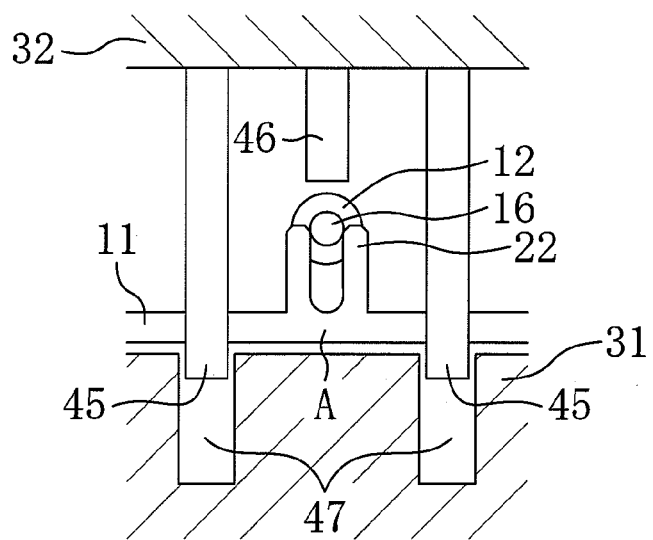
FIG. 8 is a cross-sectional view illustrating a state when cutting the connecting sections of the terminal by cut punches.
Figure 9:
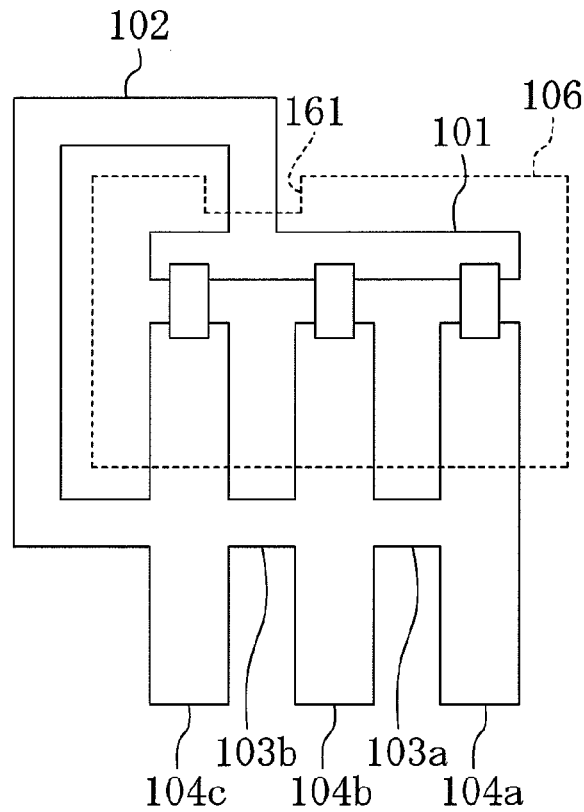
FIG. 9 is a plan view illustrating a conventional example of a terminal and a resin mold before cutting.
Figure 10:
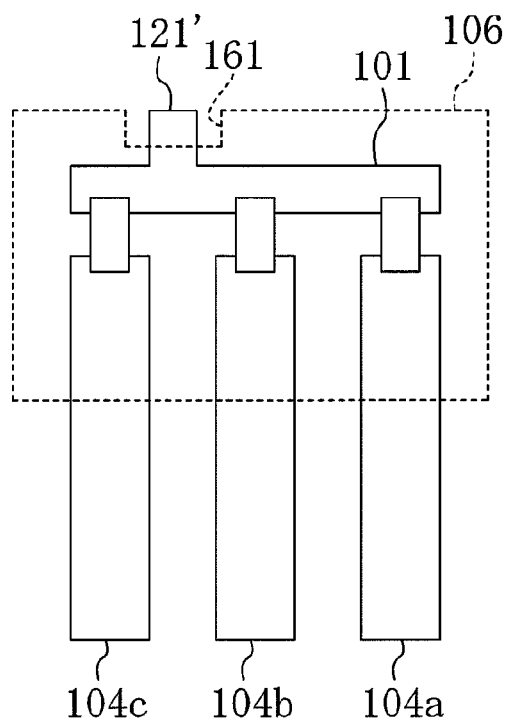
FIG. 10 is a plan view illustrating a conventional example of the terminal and the resin mold after cutting.

FIGS. 7-8 illustrate a second embodiment of the invention. FIG. 7 is a side view illustrating a main section of an upper mold 32. FIG. 8 is a cross-sectional view illustrating a state when cutting a connecting section of a terminal 11 by cut punches 45. Note that, in each of the following embodiments, the same reference numerals as those shown in FIGS. 1-6 are used to represent equivalent elements, and the description thereof will not be repeated.

As illustrated in FIG. 7, the cut punches 45 and a crimp punch 46 are mounted so as to downwardly protrude from an upper mold 32 of the second embodiment. The cut punch 45 is formed longer than the crimp punch 46, and a lower end of the cut punch 45 is positioned lower than a lower end of the crimp punch 46 when the cut punches 45 and the crimp punch 46 are mounted on the upper mold 32. On the other hand, receiving holes 47 for receiving lower sections of the cut punches 45 are formed in a lower mold 31.

A third step at which the upper mold 32 downwardly moves to cut the connecting sections 20 of the terminal 11, and a fourth step at which electronic components 12 are connected to the terminal 11 are continuously performed.

That is, as illustrated in FIG. 8, the longer cut punches 45 first cut and remove the connecting section 20, and then the lower ends of the cut punches 45 are received by the receiving holes 47 of the lower mold 31. At this point, the lower end of the crimp punch 46 does not contact a lead terminal 16 of the electronic component 12 yet.

The two cut punches 45 are received by the receiving holes 47, thereby sandwiching a section of the terminal 11 between the receiving holes 47 (a section indicated by a reference character A in FIG. 8) by the two cut punches 45. Thus, the section indicated by the reference character A can be stably fixed.

Subsequently, when downwardly moving the upper mold 32, the crimp punch 46 contacts and presses the lead terminal 16 to insert the lead terminal 16 into the second holding section 22. As a result, the lead terminal 16 is connected to the terminal 11 in which the connecting sections 20 are cut off.

Advantages of Second Embodiment

According to the second embodiment, advantages similar to those of the first embodiment can be realized. In addition, a single operation, i.e., the downward movement of the upper mold 32 allows the third step (cutting of the connecting sections 20) and the fourth step (connecting of the lead terminals 16) to be continuously performed. Consequently, the electronic component embedded connector 10 can be more easily manufactured. Further, the two cut punches 45 received by the receiving holes 47 can stably sandwich the terminal 11, and therefore the accurate connection of the lead terminal 16 of the electronic component 12 to the second holding section 22 of the fixed terminal 11 can be ensured.

Other Embodiments

In the first embodiment, the configuration has been described, in which the cut punches (cutting tools) and the crimp punch (connecting tool) move between the use position and the retreat position, but the present invention is not limited to such a configuration. A configuration may be employed, in which, e.g., one of the cut and crimp punches, which will be used is mounted on the upper mold 32, and the other one which will not be used is removed from the upper mold 32. That is, the cut punches may be first mounted on the upper mold 32 to perform the third step. Then, in order to perform the fourth step, the cut punches may be removed from the upper mold 32, and the crimp punch may be mounted on the upper mold 32.

The foregoing embodiments have been set forth merely for purposes of preferred examples in nature, and are not intended to limit the scope, applications, and use of the invention.

INDUSTRIAL APPLICABILITY

As described above, the present invention is useful for the connector in which the electronic components such as diodes are embedded, and to the method and the device for manufacturing the electronic component embedded connector.

DESCRIPTION OF REFERENCE CHARACTERS

1 Manufacturing Device
10 Electronic Component Embedded Connector
11 Terminal
12 Electronic Component
13 Resin Mold (Insulating Cover)
14 Wire Section
15 Terminal Section
16 Lead Terminal
20 Connecting Section
21 First Holding Section
22 Second Holding Section
30 Cassette (Fixing Means)
31 Lower Mold
32 Upper Mold

The invention claimed is:

1. A method for manufacturing an electronic component embedded connector including a terminal having a plurality of wire sections and terminal sections; electronic components connected to the wire sections of the terminal; and an insulating cover covering the electronic components and the wire sections of the terminal, comprising:
    a first step for fixing the terminal in which the wire sections are connected together by connecting sections, to fixing means made of insulating material;
    a second step for fixing the electronic components to the fixing means;
    a third step for cutting the connecting sections of the terminal fixed to the fixing means;
    a fourth step for connecting the electronic components fixed to the fixing means, to the terminal in which the connecting sections are cut off; and
    a fifth step for covering a section of the terminal other than the terminal sections, and the electronic components by the insulating cover.

2. The method of claim 1, wherein
the electronic component includes lead terminals;
a first holding section for holding the lead terminal is formed in the fixing means;
a second holding section for holding the lead terminal, which is arranged parallel to the first holding section is formed in the wire section of the terminal;
at the second step, the lead terminal of the electronic component is held by the first holding section to fix the electronic component to the fixing means; and
at the fourth step, the lead terminal of the electronic component is held by the second holding section in a state in which the lead terminal is held by the first holding section, and then the electronic component is connected to the terminal.

3. A device for manufacturing an electronic component embedded connector including a terminal having a plurality of wire sections and terminal sections; electronic components connected to the wire sections of the terminal; and an insulating cover covering the electronic components and the wire sections of the terminal, comprising:
    a lower mold on which fixing means made of insulating material is mounted; and
    an upper mold which is arranged so as to face the lower mold, and which upwardly/downwardly moves so as to separate from the lower mold or approach the lower mold,
    wherein the electronic components and the terminal having connecting sections for connecting the wire sections together are fixed to the fixing means mounted on the lower mold;
    the upper mold includes cutting tools for cutting the connecting sections of the terminal fixed to the fixing means mounted on the lower mold when the upper mold downwardly moves to approach and contact the lower mold;

and a connecting tool for connecting the electronic components and the wire sections of the terminal, which are fixed to the fixing means mounted on the lower mold when the upper mold downwardly moves to approach and contact the lower mold; and the cutting of the connecting sections by the cutting tools is performed before the connecting of the wire sections and the electronic components by the connecting tool.

4. The device of claim 3, wherein the cutting tools and the connecting tool move to a use position above the fixing means when using the cutting tools and the connecting tool, and move to a retreat position displaced from the use position when not using the cutting tools and the connecting tool; and the upper mold downwardly moves toward the lower mold in a state in which the cutting tools move to the use position, and the connecting tool moves to the retreat position; or downwardly moves toward the lower mold in a state in which the connecting tool moves to the use position, and the cutting tools move to the retreat position.

5. An electronic component embedded connector, characterized by being manufactured by the method of claim 1.

* * * * *